(12) United States Patent
Moon et al.

(10) Patent No.: US 11,193,015 B2
(45) Date of Patent: Dec. 7, 2021

(54) THERMOSETTING RESIN COMPOSITION FOR SEMICONDUCTOR PACKAGE AND PREPREG USING THE SAME

(71) Applicant: LG CHEM, LTD., Seoul (KR)

(72) Inventors: Hwayeon Moon, Daejeon (KR); Changbo Shim, Daejeon (KR); Hee Yong Shim, Daejeon (KR); Hyunsung Min, Daejeon (KR); Won Ki Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 180 days.

(21) Appl. No.: 16/628,582

(22) PCT Filed: Feb. 11, 2019

(86) PCT No.: PCT/KR2019/001631
§ 371 (c)(1),
(2) Date: Jan. 3, 2020

(87) PCT Pub. No.: WO2019/160287
PCT Pub. Date: Aug. 22, 2019

(65) Prior Publication Data
US 2020/0190313 A1    Jun. 18, 2020

(30) Foreign Application Priority Data

Feb. 13, 2018 (KR) .................. 10-2018-0018020
Feb. 8, 2019 (KR) .................. 10-2019-0015097

(51) Int. Cl.
| | |
|---|---|
| C08L 63/00 | (2006.01) |
| B32B 15/08 | (2006.01) |
| B32B 15/20 | (2006.01) |
| B32B 27/20 | (2006.01) |
| C08J 5/12 | (2006.01) |
| C08J 5/24 | (2006.01) |
| C08L 79/08 | (2006.01) |
| H01L 23/14 | (2006.01) |

(52) U.S. Cl.
CPC .............. *C08L 63/00* (2013.01); *B32B 15/08* (2013.01); *B32B 15/20* (2013.01); *B32B 27/20* (2013.01); *C08J 5/121* (2013.01); *C08J 5/24* (2013.01); *C08L 79/085* (2013.01); *H01L 23/145* (2013.01); *B32B 2262/101* (2013.01); *B32B 2264/102* (2013.01); *C08J 2363/00* (2013.01); *C08J 2379/08* (2013.01); *C08J 2463/00* (2013.01); *C08J 2479/08* (2013.01); *C08J 2481/06* (2013.01); *C08L 2203/20* (2013.01); *C08L 2205/025* (2013.01); *C08L 2205/035* (2013.01)

(58) Field of Classification Search
CPC ... C08L 63/00–63/10; C08K 2201/003; C08K 2201/005; B32B 15/08; B32B 27/20; C08J 5/24; H01L 23/145; C08G 59/5033
See application file for complete search history.

(56) References Cited

U.S. PATENT DOCUMENTS

| | | |
|---|---|---|
| 2011/0218272 A1 | 9/2011 | Numata et al. |
| 2012/0111621 A1 | 5/2012 | Ohigashi et al. |
| 2014/0199549 A1 | 7/2014 | Shin |
| 2015/0319855 A1 | 11/2015 | Yoon et al. |
| 2016/0017141 A1 | 1/2016 | Matsumoto et al. |
| 2016/0333137 A1 | 11/2016 | Pan |
| 2017/0009074 A1 | 1/2017 | Xi et al. |
| 2018/0148555 A1 | 5/2018 | Moon et al. |

FOREIGN PATENT DOCUMENTS

| | | |
|---|---|---|
| CN | 107614608 A | 1/2018 |
| JP | 2005119929 A | 5/2005 |
| JP | 2010202727 A | 9/2010 |
| JP | 2011-26419 A | 2/2011 |
| JP | 2012-1583 A | 1/2012 |
| JP | 2014-88509 A | 5/2014 |
| JP | 2014523953 A | 9/2014 |
| JP | 2014-193994 A | 10/2014 |
| JP | 2014-232854 A | 12/2014 |
| JP | 2016065226 A | 4/2016 |
| JP | 2016210777 A | 12/2016 |
| JP | 2018518563 A | 7/2018 |
| KR | 10-2014-0037238 A | 3/2014 |
| KR | 10-2014-0076345 A | 6/2014 |
| KR | 10-2016-0126043 A | 11/2016 |
| KR | 10-2017-0084991 A | 7/2017 |
| KR | 10-2017-0094111 A | 8/2017 |
| WO | 2010055811 A1 | 5/2010 |
| WO | 2017/122952 A1 | 7/2017 |

*Primary Examiner* — Kregg T Brooks
(74) *Attorney, Agent, or Firm* — Dentons US LLP

(57) ABSTRACT

A thermosetting resin composition having improved flowability and stiffness, and a prepreg using the same. Specifically, three kinds of fillers having different average particle diameters are combined with a binder resin system including an epoxy resin, a bismaleimide resin, a diaminodiphenylsulfone resin, and a benzoxazine resin.

12 Claims, No Drawings

THERMOSETTING RESIN COMPOSITION FOR SEMICONDUCTOR PACKAGE AND PREPREG USING THE SAME

The present application is a National Phase entry pursuant to 35 U.S.C. § 371 of International Application no. PCT/KR2019/001631 filed on Feb. 11, 2019 and claims priority to and the benefit of Korean Patent Application No. 10-2018-0018020 filed with the Korean Intellectual Property Office on Feb. 13, 2018, and Korean Patent Application No. 10-2019-0015097 filed with the Korean Intellectual Property Office on Feb. 8, 2019, the entire contents of which are incorporated herein by reference.

FIELD

The present invention relates to a thermosetting resin composition for a semiconductor package capable of having high crosslinking density of a resin system and thus ensuring excellent stiffness, and also exhibiting excellent adhesion strength to a metal foil and flowability even when using a high content of a filler, and a prepreg using the same.

BACKGROUND

A copper clad laminate used for a printed circuit board is produced by impregnating a glass fabric substrate with a thermosetting resin varnish, semi-curing the substrate to form a prepreg, and then heating and pressurizing the prepreg together with a copper foil.

The prepreg is used again for configuring a circuit pattern on such copper dad laminate and building-up thereon.

In recent years, as higher performance, thinning, and weight saving in electronic devices, communication devices, smartphones, and the like have accelerated, there has been a demand for reduction in the thickness of semiconductor packages and printed circuit boards for semiconductor packages.

Further, in order to secure the driving ability of the printed circuit board in accordance with the thinning of the semiconductor substrate, high stiffness material products are required.

Because the stiffness is associated with a modulus, materials exhibiting a high modulus must be developed.

In order to increase the modulus, there is a method of increasing the content of filler such as silica, but there is a problem that as the amount of silica increases, the adhesion strength to a copper foil decreases and the flowability deteriorates.

SUMMARY

An object of the present invention is to provide a thermosetting resin composition for a semiconductor package having improved flowability and stiffness. Another object of the present invention is to provide a prepreg using the thermosetting resin composition and a metal-clad laminate including the prepreg.

In one aspect of the invention, a thermosetting resin composition for a semiconductor package is provided, including: 100 parts by weight of a binder resin including an epoxy resin, a bismaleimide resin, a diaminodiphenylsulfone resin, and a benzoxazine resin; and 350 parts by weight or more of at least three kinds of fillers having different average particle diameters, wherein the filler includes a first filler having an average particle diameter of 0.7 µm to 1 µm, a second filler having an average particle diameter of 90 nm to 0.3 µm, and a third filler having an average particle diameter of 10 nm to 50 nm, and wherein the first filler is present in an amount of 250 parts by weight or more, relative to 100 parts by weight of the binder resin in the thermosetting resin composition.

In another aspect of the invention, a prepreg obtained by impregnating a fabric substrate with the above-mentioned thermosetting resin composition is provided.

In still another aspect of the invention, a metal clad laminate including the above-mentioned prepreg, and a metal foil integrated with the prepreg by heating and pressurizing, are provided.

The present invention can provide a thermosetting resin composition for a semiconductor package.

In addition, the present invention utilizes a prepreg produced from the above-mentioned resin composition, and thereby, can provide a metal clad laminate capable of contributing to improvement in driving performance of a thinned electronic device (for example, a printed circuit board) by achieving excellent stiffness while also having excellent adhesion strength.

DETAILED DESCRIPTION

Below, embodiments of the present invention will be described in more detail. It should be understood that words or terms used in the specification and the appended claims should not be construed as limited to general and dictionary meanings, but are to be interpreted as having a meaning that is consistent with their meaning in the context of the relevant art and the technical idea of the invention, based on the principle that an inventor may properly define the meaning of the words or terms to best explain the invention.

The term "including" or "comprising" used herein specifies a specific feature, region, integer, step, action, element, and/or component, but does not exclude the presence or addition of a different specific feature, area, integer, step, action, element, and/or component.

According to one embodiment of the present invention, a thermosetting resin composition for a semiconductor package is provided, including: 100 parts by weight of a binder resin including an epoxy resin, a bismaleimide resin, a diaminodiphenylsulfone resin, and a benzoxazine resin; and 350 parts by weight or more of at least three kinds of fillers having different average particle diameters, wherein the filler includes a first filler having an average particle diameter of 0.7 µm to 1 µm, a second filler having an average particle diameter of 90 nm to 0.3 µm, and a third filler having an average particle diameter of 10 nm to 50 nm, and wherein the first filler is present in an amount of 250 parts by weight or more, relative to 100 parts by weight of the binder resin in the total thermosetting resin composition.

The thermosetting resin composition of the present invention constitutes a resin system including a diaminodiphenylsulfone resin, and the constitution of the filler is characterized by using three kinds of specific fillers having different average particle diameters.

Therefore, the present invention provides a prepreg which can provide high-stiffness products even when in amounts of 350 parts by weight or more, which is a larger amount than conventional amounts, is used, and a metal clad laminate including the same.

Further, the resin composition of the present invention can maintain excellent flowability of the resin even when the content of the filler is large, and has excellent adhesion strength to a metal foil.

Now, the constituent components of the thermosetting resin composition according to a preferred embodiment of the present invention and the prepreg using the resin composition will be described in more detail.

First, the thermosetting resin composition of the present invention includes a binder containing an epoxy resin and a special resin, and at least three kinds of fillers having different average particle diameters, in a specific ratio.

Among them, the constitution of the binder resin is as follows.

The special resin includes a bismaleimide resin, a diaminodiphenylsulfone resin, and a benzoxazine resin.

Among the above-mentioned binder resin components, the content of the diaminodiphenylsulfone resin is preferably 5 to 20% by weight based on the total weight of the binder resin.

When the content of the diaminodiphenylsulfone resin is less than 5% by weight, the reaction rate is slow and there is a problem of non-curing. When the content of the diaminodiphenylsulfone resin is 20 parts by weight or more, there is a problem that the crosslinking density is low and the stiffness is reduced.

The diaminodiphenylsulfone resin having a weight average molecular weight of 100 to 400 may be used.

Further, the content of the benzoxazine resin may be 2 to 10% by weight based on the total weight of the binder resin.

When the content is within the above range, sufficient curing of the bismaleimide resin contained in the binder resin can be induced.

When the benzoxazine resin is contained in excess, the curing reaction rate during the production of the prepreg may be delayed more than necessary and the process efficiency may be lowered.

Therefore, the benzoxazine resin is preferably contained in an amount of 10% by weight or less based on the total weight of the binder resin.

However, if the content is too small, the effect as a desired curing agent cannot be exhibited, and thus the chemical resistance and Tg cannot be improved. Therefore, it is preferable to use the benzoxazine resin in an amount of at least 2% by weight or more.

Further, the epoxy resin and the bismaleimide resin component can be used by approximately adjusting the content so as to be 100% by weight in consideration of the physical properties required as a thermosetting resin composition.

For example, it may include 20 to 60% by weight of an epoxy resin and 20 to 70% by weight of a bismaleimide resin based on the total weight of the entire binder resin.

The remaining binder resin components will be described below.

As the epoxy resin, those commonly used in the thermosetting resin composition for a prepreg can be used, and the kind of the epoxy resin is not limited.

For example, the epoxy resin may be at least one selected from the group consisting of a bisphenol A type of epoxy resin, a phenol novolac epoxy resin, a tetraphenyl ethane epoxy resin, a naphthalene-based epoxy resin, a biphenyl-based epoxy resin, a dicyclopentadiene epoxy resin represented by the following Chemical Formula 1, and a mixture of a dicyclopentadiene-based epoxy resin and a naphthalene-based epoxy resin.

[Chemical Formula 1]

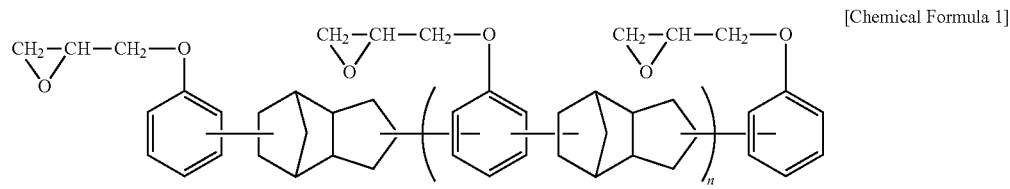

(Herein, n is an integer of 0 or 1 to 50.)

The epoxy resin may be used in an amount of 20 to 60% by weight based on the total weight of the entire binder resin.

If the amount of the epoxy resin used is less than 20% by weight, there is a problem that it is difficult to achieve a high Tg, and if it exceeds 60% by weight, there is a problem that the flowability is deteriorated.

The bismaleimide resin may be at least one selected from the group consisting of compounds represented by the following Chemical Formula 2.

[Chemical Formula 2]

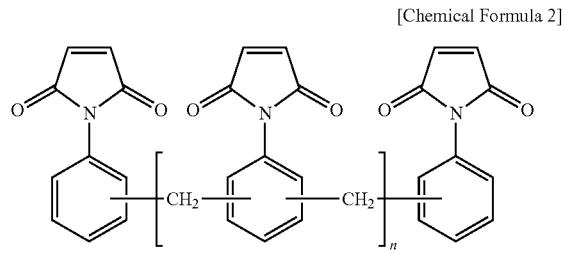

(Herein, n is an integer of 0 or 1 to 50.)

For example, the bismaleimide resin may be at least one selected from the group consisting of a diphenylmethane bismaleimide resin, a phenylene bismaleimide resin, a bisphenol A type of diphenyl ether bismaleimide resin, and a bismaleimide resin composed of oligomers of phenylmethane maleimide resins.

The bismaleimide resin may be used in an amount of 20 to 70% by weight based on the total weight of the entire binder resin.

When the amount of the bismaleimide resin used is less than 20% by weight, there is a problem that desired physical properties cannot be achieved, and when it exceeds 70% by weight, there are many unreacted groups which adversely affect characteristics such as chemical resistance.

The present invention can include a benzoxazine resin in the binder resin constitution to control the reaction rate.

That is, the phenol novolac curing agent, which has been mainly used in the past, generally has a hydroxyl group in its structure and reacts with an epoxy resin and the like at room temperature, and thus the initial reaction rate is high.

On the other hand, the benzoxazine resin used in the present invention acts as a curing agent and so has a property of generating a hydroxy group at a temperature of 150° C. or higher, whereby the reaction occurs slowly at room temperature or at an early stage, but it is possible to control the reaction rate by participating in the reaction at a predetermined temperature or higher.

Accordingly, the benzoxazine resin used in the present invention can control the reaction rate, thereby ensuring the flowability of the prepreg.

In addition, the benzoxazine enables curing of the above-mentioned epoxy resin and bismaleimide resin.

That is, the benzoxazine resin can be used as a curing agent for the epoxy resin and the bismaleimide resin.

Unlike the conventional phenol novolac resin, as the benzoxazine resin is used as a curing agent for the bismaleimide resin, the curing reaction of the resins can be carried out even at a low temperature, such as the drying process occurs less, and the curing degree of the prepreg is lowered, thereby ensuring flowability.

This also provides the effect of minimizing appearance defects occurring in the process of manufacturing the metal laminate as well as in the pressurizing process used in the build-up process.

Such a benzoxazine resin may be at least one selected from the group consisting of a bisphenol A type of benzoxazine resin, a bisphenol F type of benzoxazine resin, a phenolphthalein benzoxazine resin, and a mixture of these benzoxazine resins and some curing accelerators.

Filler

In particular, in the present invention, by mixing and using at least three kinds of fillers having different average particle diameters in a specific ratio without using conventional general fillers, the stiffness properties of the resin composition can be improved and excellent flowability can be ensured.

In the composition, the total content of at least three kinds of fillers having different average particle diameters relative to 100 parts by weight of the binder resin may be 350 parts by weight or more.

In addition, such a filler may be of a slurry type.

The first filler may constitute 250 parts by weight or more of the total filler content, relative to 100 parts by weight of the binder resin in the thermosetting resin composition.

Specifically, in the present disclosure, when at least three kinds of fillers having different average particle sizes are included, they may be included as a constitution of the first filler having the largest average particle diameter, the second filler having the middle average particle diameter, and the third filler having the smallest average particle diameter.

At this time, by using the content range of the filler having the largest average particle diameter among the total content of the fillers as at least 250 parts by weight, relative to 100 parts by weight of the binder resin in the thermosetting resin composition, the stiffness is ensured and the flowability is also excellent.

The total content of the three kinds of fillers may be 350 parts by weight or more, relative to 100 parts by weight of the binder resin in the thermosetting resin composition.

Even if the three kinds of fillers are used in an amount of 350 parts by weight or more, the flowability of the prepreg may be lowered. Therefore, it is good to use the fillers to the level that the flowability of the resin is not lowered.

Preferably, the total content of the three kinds of fillers may be 350 to 550 parts by weight or 370 to 550 parts by weight.

Specifically, the present invention may increase the filling rate by increasing the packing density by using a small size of a nanoparticle size together with a large size of a microparticle size.

Further, in the present invention, when three types of fillers having different particle diameters are used, those having a maximum size of 1 µm or more are not included.

Therefore, according to the present invention, because the thermosetting resin composition exhibits a higher filling rate than in the case of using only a conventional filler having a single particle diameter, the compatibility with the resin may be increased, and accordingly, it is possible to exhibit the optimum flowability of the prepreg and to ensure excellent PCB processability.

As described above, the at least three kinds of fillers are a first filler having an average particle diameter of 0.7 µm to 1 µm, a second filler having an average particle diameter of 90 nm to 0.3 µm, and a third filler having an average particle diameter of 10 nm to 50 nm.

The confirmation (measurement) and determination method of the average particle diameter may be performed according to the particle size analysis D50 method.

If the average particle diameter of the first filler is less than 0.7 µm, there is a problem in moldability because the second filler and the packing size do not match. When the particle diameter exceeds 1 µm, the thickness of the CCL and PPG is thin in the case of a thinned substrate, and there is a problem in PCB processability due to a large filler issue.

If the average particle diameter of the second filler is less than 90 nm, there is a problem in moldability because the third filler and the packing size do not match each other. If it is more than 0.3 µm, there is a problem in moldability because the first filler and the packing size do not match.

If the average particle diameter of the third filler is less than 10 nm, there is a problem that it cannot act as nano-silica, and if it is more than 50 nm, there is a problem in moldability because the packing size does not match the second filler.

In this case, the range of particle diameters of the first to third fillers whose average particle size is limited is as follows.

The range of the particle diameter of the first filler may be 0.7 µm to 1.2 µm.

The range of the particle diameter of the second filler may be 90 nm to 0.3 µm.

The range of the particle diameter of the third filler may be 10 nm to 50 nm.

In addition, the total content of the three kinds of fillers may be adjusted within a range of 350 parts by weight or more, 350 to 550 parts by weight, or 370 to 550 parts by weight, relative to 100 parts by weight of the binder resin in the thermosetting resin composition.

However, it is preferable that the ratio of the first filler to the total filler is the largest relative to the second and third fillers in terms of the content of the entire filler. The content of the remaining second filler and third filler should then be properly adjusted, excluding the content of the first filler.

The reason is to increase the packing density of the resin composition, whereby the thermosetting resin composition has an increased filling rate, thereby ensuring optimized moldability and flowability.

According to one embodiment, the first filler can be used in an amount of about 77% to 85% by weight based on the total weight of the three kinds of fillers used.

Also, when compared to the weight of the binder resin in the thermosetting resin composition, the first filler may be used in an amount of 250 parts by weight or more, 250 to 400 parts by weight, or 280 to 400 parts by weight, relative to 100 parts by weight of the binder resin in the thermosetting resin composition.

More preferably, the three kinds of fillers are used in the following amounts: 280 to 400 parts by weight of a first filler having an average particle diameter of 0.7 µm to 1 µm; 30 to 90 parts by weight of a second filler having an average particle diameter of 90 nm to 0.3 µm, and 35 to 60 parts by weight of a third filler having an average particle diameter of 10 nm to 50 nm.

At this time, if the content of the first filler is less than 250 parts by weight, the amount of the second and third fillers is increased, and there is a problem that the flowability is rather poor. If the amount of the first filler is more than 400 parts by weight, the packing ratio is not so large and there is a problem in moldability.

If the content of the second filler is less than 30 parts by weight, the packing ratio is not suitable, and thus there is a problem in moldability. If the amount is more than 90 parts by weight, the flowability is deteriorated and the adhesion strength to the copper foil is lowered.

If the content of the third filler is less than 35 parts by weight, the packing ratio is not suitable and there is a problem in moldability. If it exceeds 60 parts by weight, the flowability is deteriorated and the adhesion strength to the copper foil is lowered.

Moreover, the three kinds of fillers may each independently be at least one selected from the group consisting of silica aluminum trihydroxide, magnesium hydroxide, molybdenum oxide, zinc molybdate, zinc borate, zinc stannate, alumina, clay, kaolin, talc, calcined kaolin, calcined talc, mica, glass staple fiber, glass fine powder, and hollow glass.

That is, the first to third fillers having different average particle diameters may use at least one selected from the above-mentioned materials.

In addition, it is preferable that the three kinds of fillers are not used in the form of powder particles but made in a slurry type.

That is, the powder type of filler has a problem that the dispersibility is lower than that of the slurry type of filler.

If the filler is not well dispersed, the flowability tends to be lowered.

On the other hand, the thermosetting resin composition according to one embodiment of the present invention may include one or more additives selected from the group consisting of a solvent, a curing accelerator, a flame retardant, a lubricant, a dispersant, a plasticizer, and a silane coupling agent.

Specifically, in the present invention, a solvent can be added to the resin composition and used as a solution, as needed.

The solvent is not particularly limited in its type as long as it exhibits good solubility in the resin component, and alcohols, ethers, ketones, amides, aromatic hydrocarbons, esters, nitriles, and the like may be used. Further, they may be used alone or in a mixed solvent of two or more thereof.

Furthermore, the content of the solvent is not particularly limited as long as it can impregnate the resin composition in glass fiber during preparation of the prepreg.

The curing accelerator may be used for the purpose of accelerating the curing of the binder described above.

The type or mixing ratio of the curing accelerator is not particularly limited, and for example, an imidazole-based compound, an organophosphorus compound, a tertiary amine, a quaternary ammonium salt, and the like may be used, and two or more thereof may be used in combination.

Preferably, the present invention uses an imidazole-based compound as the curing accelerator.

When the imidazole-based curing accelerator is used, the curing accelerator is used in an amount of about 0.1 to 1 part by weight, relative to 100 parts by weight of the binder resin on the thermosetting resin composition, and thus it can be used in a lower amount than 5% to 15% by weight described above.

Further, examples of the imidazole-based curing accelerator include an imidazole such as 1-methyl imidazole, 2-methyl imidazole, 2-ethyl 4-methyl imidazole, 2-phenyl imidazole, 2-cyclohexyl 4-methyl imidazole, 4-butyl 5-ethyl imidazole, 2-methyl 5-ethyl imidazole, 2-octhyl 4-hexyl imidazole, 2,5-dichloro-4-ethyl imidazole, 2-butoxy 4-allyl imidazole, and imidazole derivatives, and 2-methyl imidazole or 2-phenyl imidazole is particularly preferred due to its excellent reaction stability and low cost.

In addition, the thermosetting resin composition of the present invention may further include at least one additive selected from the group consisting of a flame retardant, a lubricant, a dispersant, a plasticizer, and a silane coupling agent, which are commonly added as needed.

Furthermore, the resin composition of the present invention may further include various high polymer compounds such as other thermosetting resins, thermoplastic resins, and oligomers, and elastomers thereof, and other salt resistance compounds or additives, as long as the inherent characteristics of the resin composition are not impaired.

These are not particularly limited as long as they are selected from those that are commonly used.

<Prepreg>

According to another embodiment of the present invention, a prepreg prepared by impregnating a fabric substrate with the thermosetting resin composition is provided.

The prepreg refers to one in which the thermosetting resin composition is impregnated into the fabric substrate in a semi-cured state.

The fabric substrate is not particularly limited in its type, but a glass fabric substrate, a synthetic fabric substrate made of a woven or nonwoven fabric mainly composed of a polyamide-based resin fiber, such as a polyamide resin fiber, an aromatic polyamide resin fiber, a polyester-based resin fiber such as a polyester resin fiber, an aromatic polyester resin fiber, or a wholly aromatic polyester resin fiber, a polyimide resin fiber, or a fluororesin fiber, etc., and a paper substrate mainly composed of craft paper, cotton linter paper, mixed paper of linter and craft pulp, etc. may be used. Preferably, a glass fabric substrate may be used.

In addition, the glass fabric substrate can improve the strength of the prepreg and reduce the absorption rate, and can also reduce the coefficient of thermal expansion.

The glass substrate used in the present invention may be selected from glass substrates used for various printed circuit board materials.

Examples thereof include glass fibers such as E glass, D glass, S glass, T glass, and NE glass, but are not limited thereto.

The glass substrate material may be selected according to the intended use or performance, as needed.

The glass substrate forms are typically woven fabric, nonwoven fabric, roving, chopped strand mat, or surfacing mat.

The thickness of the glass substrate is not particularly limited, but about 0.01 to 0.3 mm, etc. may be used.

Among these materials, the glass fiber material is more preferable in terms of the strength and water absorption property.

In addition, in the present invention, the method for preparing the prepreg is not particularly limited, and it may be prepared by a method that is well known in the art.

For example, the method for preparing the prepreg includes an impregnation method, a coating method using various coaters, a spraying method, and the like.

In the case of the impregnation method, the prepreg may be prepared by preparing a varnish, followed by impregnating the fabric substrate with the varnish.

That is, the preparation conditions and the like of the prepreg are not particularly limited, but it is preferable that the prepreg is used in a varnish state in which a solvent is added to the thermosetting resin composition.

The solvent for the resin varnish is not particularly limited as long as it is miscible with the resin component and has good solubility.

Specific examples thereof include ketones such as acetone, methyl ethyl ketone, methyl isobutyl ketone, and cyclohexanone, aromatic hydrocarbons such as benzene, toluene, and xylene, amides such as dimethyl formamide and dimethylacetamide, and aliphatic alcohols such as methyl cellosolve, butyl cellosolve, and the like.

Further, it is preferable that at least 80% by weight of the used solvent is volatilized at the time of preparing the prepreg.

Therefore, there is no limitation in the preparation method or drying conditions, etc. The temperature at the time of drying may be about 80° C. to 180° C., and the time is not particularly limited due to a balance with a gelation time of the varnish.

Furthermore, it is preferable that the impregnation amount of the varnish is adjusted such that a resin solid content of the varnish becomes about 30 wt % to 80 wt % based on the total amount of the resin solid content of the varnish and the substrate.

<Metal Clad Laminate>

According to still another embodiment of the present invention, a metal clad laminate including the above-mentioned prepreg, and a metal foil integrated with the prepreg by heating and pressurizing, is provided.

The metal foil may include: a copper foil; an aluminum foil; a composite foil of a three-layer structure having an intermediate layer of nickel, nickel-phosphorus, a nickel-tin alloy, a nickel-iron alloy, lead, or a lead-tin alloy, and having copper layers of different thicknesses on respective sides; or a composite foil of a two-layer structure composed of aluminum and a copper foil.

According to a preferred embodiment, the metal foil used in the present invention may be a copper foil or an aluminum foil, and it may have a thickness of about 2 to 200 µm, but may preferably have a thickness of about 2 to 35 µm.

Preferably, a copper foil is used as the metal foil.

In addition, according to the present invention, as for the metal foil, a composite foil of a three-layer structure having an intermediate layer of nickel, nickel-phosphorus, a nickel-tin alloy, a nickel-iron alloy, lead, a lead-tin alloy, etc. and in which a copper layer of 0.5 to 15 µm and a copper layer of 10 to 300 µm are provided on respective sides thereof, and a composite foil of a two-layer structure composed of aluminum and a copper foil, may be used.

At least one metal laminate including the prepreg prepared as described above can be used for manufacturing a double-sided or multilayer printed circuit board after one or more sheets are laminated.

According to the present invention, the double-sided or multilayer printed circuit board may be manufactured by processing a circuit on the metal clad laminate, and the circuit may be processed by a method performed in a manufacturing process of a general double-sided or multi-layer printed circuit board.

Further, in order to evaluate the flowability of the prepreg, the degree of flow after lamination may be understood by using a 12 µm copper foil with high roughness of the copper foil and a 2 µm copper foil with low roughness, respectively.

The evaluation method of the flowability may be carried out by removing the copper foil layer by etching and then visually observing and comparing the amount flowing out to the outside, thereby visually evaluating the surface of the cured prepreg.

As described above, the present invention may be applied to all printed circuit boards in various fields, and may be preferably used to manufacture a printed circuit board for a semiconductor package by using the thermosetting resin composition described above.

The present invention will be described in more detail with reference to examples below. However, the examples are only for illustrative purposes and are not intended to limit the scope of the present invention.

EXAMPLES AND COMPARATIVE EXAMPLES

The components of the compositions shown in Tables 1 and 2 below were mixed at a speed of 400 rpm in a high-speed stirrer to prepare resin compositions (resin varnishes) of Examples 1 to 3 and Comparative Examples 1 to 8, respectively.

Then, each resin varnish was impregnated with glass fabric (1039 manufactured by Nittobo, T-glass) having a thickness of 25 µm, and was then dried with hot air at a temperature of 100 to 140° C. to prepare a prepreg with a thickness of 35 µm.

After one sheet of the prepreg prepared as described above was laminated, a copper foil (thickness: 12 µm, manufactured by Mitsui) was laminated by positioning on both surfaces thereof, and pressurized to prepare a copper clad laminate.

The content of the binder resin components were determined as percent by weight (of a total amount of binder of 100% by weight), and the content of silica was based on 100 parts by weight of the binder resin.

TABLE 1

| | | Examples | | | Comparative Examples | | | |
|---|---|---|---|---|---|---|---|---|
| | | 1 | 2 | 3 | 1 | 2 | 3 | 4 |
| Binder | Epoxy resin | 40 | 30 | 40 | 40 | 40 | 40 | 45 |
| | BMI resin | 35 | 50 | 35 | 35 | 35 | 35 | 20 |
| | DDS resin | 15 | 10 | 15 | 15 | 15 | 15 | 25 |
| | Benzoxazine resin | 10 | 10 | 10 | 10 | 10 | 10 | 10 |
| Filler | Filler A | 324 | 324 | 288 | 360 | 216 | — | 324 |
| | Filler B | — | — | — | — | — | 324 | — |
| | Filler C | — | — | 72 | — | — | 36 | — |
| | Filler D | 36 | 36 | — | — | 144 | — | 36 |
| | Filler E | 40 | 40 | 40 | 40 | 40 | 40 | 40 |
| | Filler F | — | — | — | — | — | — | — |

TABLE 2

|  |  | Comparative Examples | | | | |
|---|---|---|---|---|---|---|
|  |  | 5 | 6 | 7 | 8 | 9 |
| Binder | Epoxy resin | 45 | 40 | 40 | 30 | 40 |
|  | BMI resin | 42 | 35 | 35 | 30 | 35 |
|  | DDS resin | 3 | 15 | 15 | — | 15 |
|  | Benzoxazine resin | 10 | 10 | 10 | 10 | 10 |
|  | Cyanate ester resin | — | — | — | 40 | — |
| Filler | Filler A | 324 | — | 36 | 324 | 785 |
|  | Filler B | — | — | — | — | — |
|  | Filler C | — | — | — | — | — |
|  | Filler D | 36 | 36 | 324 | 36 | 30 |
|  | Filler E | 40 | 40 | 40 | 40 | 30 |
|  | Filler F | — | 324 | — | — | — |

Epoxy resin: Naphthalene-based epoxy resin (HP4710, DIC)

BMI resin: Bismaleimide-based resin (BMI-2300, DAIWA)

Cyanate ester resin: Novolac-type cyanate resin (PT-30S, Lonza)

Benzoxazine resin: Phenolphthalein-based benzoxazine resin (XU8282, Huntsman)

DDS resin: Diaminodiphenyl sulfone resin (4'4-DDS, Sino Rich Chemical)

Filler A: Slurry-type filler, average particle diameter of 1 μm (SC4050MTO, Admatechs)

Filler B: Slurry-type filler, average particle diameter of 0.5 μm (SC2050MTO Admatechs)

Filler C: Slurry-type filler, average particle diameter of 0.3 μm (SX-CM1, Admatechs)

Filler D: Slurry-type filer, average particle diameter of 100 nm (Optisol-SSKU9, Ranco)

Filler E: Slurry-type filler, average particle diameter of 50 nm (YA050C-MJE, Admatechs)

Filler F: Powder-type filler, average particle diameter of 1.5 μm (SO-C5, Admatechs)

EXPERIMENTAL EXAMPLE

The physical properties of the copper-clad laminates prepared in the examples and comparative examples were measured by the following methods, and the results are shown in Tables 3 and 4 below.

(1) Resin Flow (RF)

According to IPC-TM-650 (2.3.17), RF was measured using a cover press in the prepreg state.

(2) Moldability (Presence or Absence of Voids)

The cross-section of the copper clad laminate was cut from specimens for observation.

The moldability was evaluated by examining the presence or absence of voids through a scanning electron microscope.

(3) Glass Transition Temperature (Tg)

After removing the copper foil of the copper clad laminate by etching, the glass transition temperature was measured by DMA and TMA.

(4) Modulus

After removing the copper foil of the copper clad laminate by etching, the modulus was measured by DMA.

(5) Coefficient of Thermal Expansion (CTE)

After removing the copper foil of the copper clad laminate by etching, the CTE was measured by TMA.

(6) Evaluation of adhesion strength (peel strength): The adhesion strength of a 1 cm width section of the copper clad laminate was evaluated using a texture analyzer.

TABLE 3

|  | Examples | | | Comparative Examples | | | |
|---|---|---|---|---|---|---|---|
|  | 1 | 2 | 3 | 1 | 2 | 3 | 4 |
| Resin flow (%) | 5 | 5 | 5 | 2 | 2 | 2 | 5 |
| Moldability (presence or absence of voids) | Absence | Absence | Absence | Presence | Presence | Presence | Absence |
| Tg (° C., DMA) | 300 | 300 | 300 | 300 | 300 | 300 | 280 |
| Modulus (GPa, 30/260° C.) | 30/24 | 29/23 | 30/24 | 30/24 | 30/24 | 30/24 | 27/21 |
| CTE (ppm/° C. 50-150° C.) | 4 | 4 | 4 | 4 | 4 | 4 | 6 |
| Desmear (g/50 cm$^2$) | 0.003 | 0.003 | 0.003 | 0.003 | 0.003 | 0.003 | 0.005 |
| Peel strength (kgf/cm) | 0.6 | 0.6 | 0.6 | 0.5 | 0.5 | 0.5 | 0.5 |

TABLE 4

|  | Comparative Examples | | | | |
|---|---|---|---|---|---|
|  | 5 | 6 | 7 | 8 | 9 |
| Resin flow (%) | 5 | 2 | 0 | 4 | 0 |
| Moldability (presence or absence of voids) | Absence | Presence | Presence | Absence | Presence |
| Tg (° C., DMA) | 280 | 300 | 300 | 300 | 300 |
| Modulus (GPa, 30/260° C.) | 26/20 | 29/23 | 29/23 | 30/24 | 31/25 |
| CTE (ppm/° C., 50-150° C.) | 7 | 5 | 5 | 4 | 3 |
| Desmear (g/50 cm$^2$) | 0.01 | 0.003 | 0.003 | 0.004 | 0.004 |
| Peel strength (kgf/cm) | 0.5 | 0.5 | 0.5 | 0.4 | 0.1 |

As shown in Tables 3 and 4, Examples 1 to 3 of the present invention were generally excellent in physical properties as compared with Comparative Examples 1 to 9.

Particularly, according to the present invention, it was confirmed that both the resin flowability and the stiffness were excellent, and the adhesion strength to the copper foil was also excellent.

On the other hand, Comparative Example 1 in which only two kinds of fillers were used, Comparative Example 2 deviating from the range of the ratio of the present invention even when three kinds of fillers were used, and Comparative Example 3 in which the sizes of the three kinds of fillers were different from those of the present invention, all had poor resin flowability.

Additionally, in Comparative Example 4 in which the ratio of the DDS resin was different from that of the present invention, the moldability was poor even when the resin flowability was excellent, and the overall physical properties including the glass transition temperature and the like were poor.

In the case of Comparative Example 5 in which the DDS content was small and Comparative Example 8 in which the DDS was not contained, both CTE and Desmear were weak due to the problem of non-curing.

In the case of Comparative Examples 6 to 7, the CTE and the peel strength were relatively poor compared to the present invention, since the average particle diameter of the fillers was outside the range of the present invention.

In the case of Comparative Example 6, the CTE and the peel strength were lowered by including the powder-type filler.

In the case of Comparative Example 9, even if the first filler having an average particle diameter of 1 μm was used, the content thereof was excessively contained, and therefore the CTE and the peel strength were lowered due to poor resin flowability and moldability of the thermosetting resin composition.

The invention claimed is:

1. A thermosetting resin composition, including:
   100 parts by weight of a binder resin including an epoxy resin, a bismaleimide resin, a diaminodiphenylsulfone resin, and a benzoxazine resin; and
   350 parts by weight or more of a filler composed of at least three kinds of fillers having different average particle diameters,
   wherein the filler comprises a first filler having an average particle diameter of 0.7 μm to 1 μm, a second filler having an average particle diameter of 90 nm to 0.3 μm, and a third filler having an average particle diameter of 10 nm to 50 nm, and
   wherein the first filler is present in an amount of 250 parts by weight or more, relative to 100 parts by weight of the hinder resin in the thermosetting resin composition.

2. The thermosetting resin composition according to claim 1, wherein the binder comprises 5 to 20% by weight diaminodiphenylsulfone resin, based on the total weight of the binder.

3. The thermosetting resin composition according to claim 1, wherein the three kinds of fillers include 350 to 550 parts by weight, relative to 100 parts by weight of the binder resin on the thermosetting resin composition.

4. The thermosetting resin composition according to claim 1, wherein the three kinds of fillers include, relative to 100 parts by weight of the binder resin in the thermosetting resin composition,
   250 to 400 parts by weight of the first filler having an average particle diameter of 0.7 μm to 1 μm,
   30 to 90 parts by weight of the second filler having an average particle diameter of 90 nm to 0.3 μm, and
   35 to 60 parts by weight of the third filler having an average particle diameter of 10 nm to 50 nm.

5. The thermosetting resin composition according to claim 1, wherein the diaminodiphenylsulfone resin has a weight average molecular weight of 100 to 400.

6. The thermosetting resin composition for according to claim 1, wherein the content of the benzoxazine resin is 2 to 10% by weight based on the total weight of the binder resin.

7. The thermosetting resin composition for a semiconductor package according to claim 1, wherein the three kinds of fillers independently include at least one selected from the group consisting of silica aluminum trihydroxide, magnesium hydroxide, molybdenum oxide, zinc molybdate, zinc borate, zinc stannate, alumina, clay, kaolin, talc, calcined kaolin, calcined talc, mica, glass staple fiber, glass fine powder, and hollow glass.

8. The thermosetting resin composition according to claim 1, wherein the epoxy resin is at least one selected from the group consisting of a bisphenol A type of epoxy resin, a phenol novolac epoxy resin, a tetraphenyl ethane epoxy resin, a naphthalene-based epoxy resin, a biphenyl-based epoxy resin, a dicyclopentadiene epoxy resin, and a mixture of a dicyclopentadiene-based epoxy resin and a naphthalene-based epoxy resin.

9. The thermosetting resin composition according to claim 1, wherein the bismaleimide resin is at least one selected from the group consisting of compounds represented by the following Chemical Formula 2:

[Chemical Formula 2]

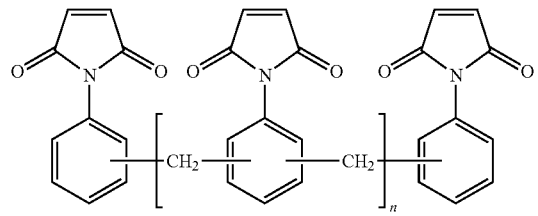

(wherein n is an integer of 0 or 1 to 50).

10. The thermosetting resin composition according to claim 1,
    further comprising one or more additives selected from the group consisting of a solvent, a curing accelerator, a flame retardant, a lubricant, a dispersant, a plasticizer, and a silane coupling agent.

11. A prepreg obtained by impregnating a fiber substrate with the thermosetting resin composition according to claim 1.

12. A metal clad laminate comprising the prepreg according to claim 11, and
    a metal foil integrated with the prepreg by heating and pressurizing.

* * * * *